(12) United States Patent
Hong et al.

(10) Patent No.: US 11,164,794 B2
(45) Date of Patent: Nov. 2, 2021

(54) SEMICONDUCTOR STRUCTURES IN A WIDE GATE PITCH REGION OF SEMICONDUCTOR DEVICES

(71) Applicant: GLOBALFOUNDRIES U.S. INC., Santa Clara, CA (US)

(72) Inventors: Wei Hong, Clifton Park, NY (US); Liu Jiang, Clifton Park, NY (US); Yanping Shen, Saratoga Springs, NY (US)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 0 days.

(21) Appl. No.: 16/531,114

(22) Filed: Aug. 4, 2019

(65) Prior Publication Data

US 2021/0035869 A1    Feb. 4, 2021

(51) Int. Cl.
| | |
|---|---|
| *H01L 29/76* | (2006.01) |
| *H01L 21/8238* | (2006.01) |
| *H01L 27/088* | (2006.01) |
| *H01L 27/092* | (2006.01) |
| *H01L 29/08* | (2006.01) |
| *H01L 29/417* | (2006.01) |
| *H01L 29/423* | (2006.01) |

(52) U.S. Cl.
CPC ........... *H01L 21/823814* (2013.01); *H01L 21/823871* (2013.01); *H01L 27/088* (2013.01); *H01L 27/092* (2013.01); *H01L 27/0924* (2013.01); *H01L 29/0847* (2013.01); *H01L 29/41775* (2013.01); *H01L 29/4238* (2013.01)

(58) Field of Classification Search
None
See application file for complete search history.

(56) References Cited

U.S. PATENT DOCUMENTS

| | | | |
|---|---|---|---|
| 5,929,469 A * | 7/1999 | Mimoto | H01L 27/11807 257/207 |
| 9,214,462 B2 | 12/2015 | Cheng et al. | |
| 9,437,470 B2 * | 9/2016 | Lu | H01L 21/8234 |
| 9,818,873 B2 | 11/2017 | Alptekin et al. | |
| 2003/0116819 A1 * | 6/2003 | Hokazono | H01L 21/76895 257/510 |
| 2008/0251934 A1 * | 10/2008 | Mandelman | H01L 21/76889 257/777 |
| 2015/0349123 A1 | 12/2015 | Cheng et al. | |

* cited by examiner

*Primary Examiner* — Hung K Vu
(74) *Attorney, Agent, or Firm* — David Cain

(57) ABSTRACT

A semiconductor device is provided that includes an active region above a substrate, a first gate structure, a second gate structure, a first semiconductor structure, a second semiconductor structure and a semiconductor bridge. The first gate semiconductor and the second semiconductor structure are in the active region and between the first and the second gate structures. The first semiconductor structure is adjacent to the first gate structure and a second semiconductor structure is adjacent to the second gate structure. The semiconductor bridge is in the active region electrically coupling the first and the second semiconductor structures.

19 Claims, 11 Drawing Sheets

SEMICONDUCTOR STRUCTURES IN A WIDE GATE PITCH REGION OF SEMICONDUCTOR DEVICES

FIELD OF THE INVENTION

The disclosed subject matter relates generally to semiconductor devices, and more particularly to semiconductor devices having multiple semiconductor structures in a wide gate pitch region and methods of forming the same.

BACKGROUND

The global market for radio frequency (RF) semiconductor devices is growing at an exponential rate. There is an increasing demand from industries, such as telecommunications, radar systems and computer networks, to provide reliable and high speed connectivity. The typical operating frequency of RF semiconductor devices ranges from 3 kHz to 300 GHz.

RF semiconductor devices, specifically the field effect transistor (FET) devices for RF applications, are required to handle high-speed switching of high-powered RF signals. Presence of parasitic components in RF semiconductor devices, such as parasitic inductance, capacitance, conductance and resistance, may combine to attenuate and degrade the RF signals considerably. RF signal losses are more significant at a higher operating frequency, and it is critical to ensure the RF signal losses are kept low, or at least at an acceptable level for a specific application.

One of the possible solutions is to fabricate the RF FET devices in a wide gate pitch region, thereby enabling the contact structures to be positioned at a greater distance from gate structures in order to reduce the parasitic capacitance. However, forming semiconductor structures in a wide gate pitch region is challenging due to an inherent "pattern loading effect".

The pattern loading effect occurs during a simultaneous growing of semiconductor material in regions of higher pattern density and in regions of lower pattern density and results in a difference in growth rates of the semiconductor structures in these regions. The amount of semiconductor material grown may differ, and this causes non-uniformity in the thicknesses of resulting semiconductor structures. For example, a higher pattern density area with smaller areas for semiconductor material to grow may have a higher growth rate than that of a lower pattern density area. The non-uniformity of semiconductor structures in terms of layer thicknesses and composition may adversely affect the RF FET device performance.

As described above, semiconductor devices having multiple semiconductor structures in a wide gate pitch region and methods of forming the same are presented.

SUMMARY

To achieve the foregoing and other aspects of the present disclosure, semiconductor devices having multiple semiconductor structures in a wide gate pitch region and methods of forming the same are presented.

According to an aspect of the disclosure, a semiconductor device is provided that includes an active region over a substrate, a first gate structure, a second gate structure, a first semiconductor structure, a second semiconductor structure and a semiconductor bridge. The first semiconductor structure and the second semiconductor structure are in the active region between the first and the second gate structures. The first semiconductor structure is adjacent to the first gate structure and a second semiconductor structure is adjacent to the second gate structure. The semiconductor bridge is in the active region electrically coupling the first and the second semiconductor structures.

According to another aspect of the disclosure, a method of forming a semiconductor device is provided that includes providing an active region over a substrate, the active region having a top surface. A first gate structure and a second gate structure are formed over the active region. A first recessed region and a second recessed region are formed in the active region, the first and the second recessed regions are separated by an elevated section of the active region between the first and the second gate structures. A first semiconductor structure is formed in the first recessed region, a second semiconductor structure is formed in the second recessed region and a semiconductor bridge is formed over the elevated section. The semiconductor bridge electrically couples the first and the second semiconductor structures.

According to yet another aspect of the disclosure, a method of forming a semiconductor device is provided that includes providing an active region over a substrate, the active region having a top surface. A first gate structure and a second gate structure is formed over the active region A first recessed region and a second recessed region, separated by an elevated section formed therebetween, are formed in the active region between the first and the second gate structures. A first epitaxy process is performed to fill the first recessed region to form a first semiconductor structure and fill the second recessed region to form a second semiconductor structure. The first and the second semiconductor structures have top surfaces substantially coplanar with the top surface of the active region. A second epitaxy process is performed to grow a semiconductor bridge over the elevated section. The semiconductor bridge electrically couples the first and the second semiconductor structures.

BRIEF DESCRIPTION OF THE DRAWINGS

The embodiments of the present disclosure will be better understood from a reading of the following detailed description, taken in conjunction with the accompanying drawings.

Figure 1A:
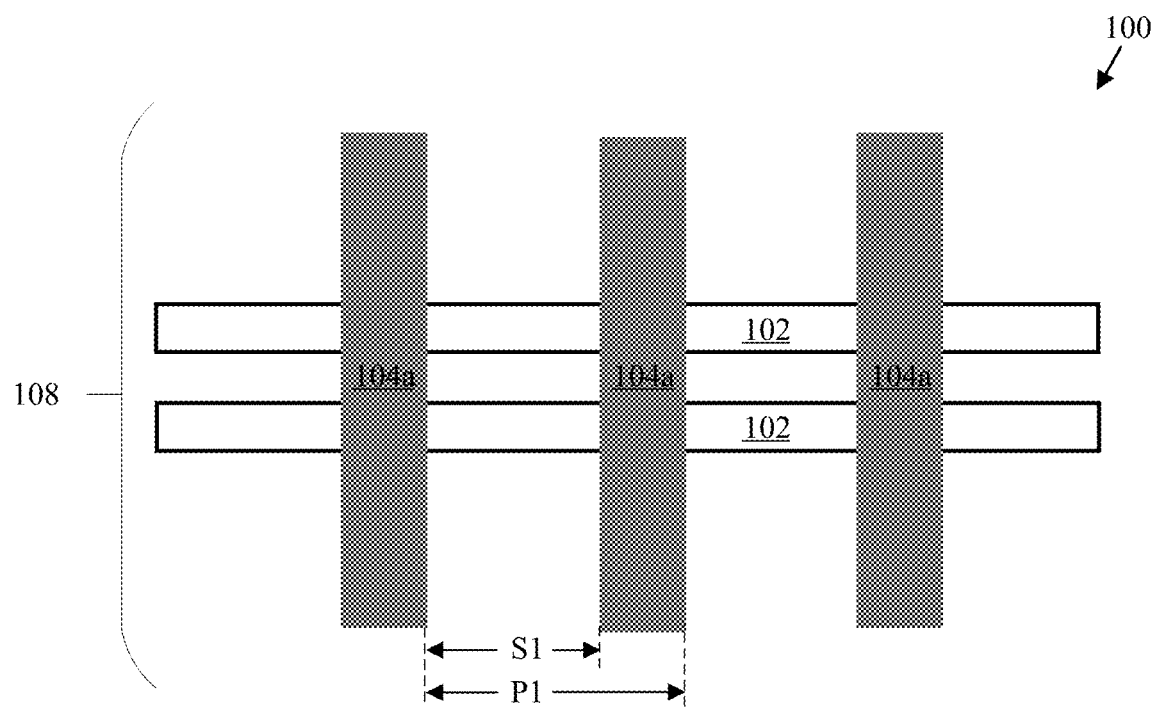
FIGS. 1A-1B are simplified top views of a semiconductor device having different gate pitches, according to embodiments of the disclosure.

For simplicity and clarity of illustration, the drawings illustrate the general manner of construction, and certain descriptions and details of well-known features and techniques may be omitted to avoid unnecessarily obscuring the discussion of the described embodiments of the disclosure. Additionally, elements in the drawings are not necessarily drawn to scale. For example, the dimensions of some of the elements in the drawings may be exaggerated relative to other elements to help improve understanding of embodiments of the disclosure. The same reference numerals in

DETAILED DESCRIPTION

Various embodiments of the disclosure are described below. The embodiments disclosed herein are exemplary and not intended to be exhaustive or limiting to the disclosure.

The present disclosure relates to semiconductor devices having multiple semiconductor structures in a wide gate pitch region and methods of forming the same. The semiconductor devices may be complementary metal-oxide-semiconductor (CMOS) devices including P-type metal-oxide-semiconductor (PMOS) devices and/or N-type metal-oxide-semiconductor (NMOS) devices. It is understood that the following disclosure is not limited to any particular type of semiconductor devices. The methods disclosed herein may be applied to any type of semiconductor devices, such as tri-gate field effect transistor (FET) devices, fin-type FET (FinFET) devices or planar-type metal-oxide-semiconductor FET (MOSFET) devices.

The semiconductor devices may be fabricated with a gate-first, a gate-last or a hybrid fabrication process. In a gate-first process, conductive layers are formed over active regions and patterned to form gate structures. This is followed by conventional CMOS processing, including formation of source and drain regions, formation of gate spacers and deposition of inter-level dielectric (ILD) material. In a gate-last process, dummy gate structures are formed followed by conventional CMOS processing including formation of the source and drain regions, formation of gate spacers and deposition of ILD material. Thereafter, the dummy gate structures are removed followed by conventional formation of replacement gate structures. In the hybrid fabrication process, a gate structure of one type of device may be formed first and a gate structure of another type of device may be formed last.

The term "gate pitch" as used herein defines a distance from a left edge of a gate structure to a left edge of an adjacent gate structure. The minimum gate pitch in a semiconductor device is termed "contacted poly pitch" (CPP), with a corresponding minimum gate-to-gate spacing. The term "gate spacing" as used herein defines a distance between two adjacent gate structures. The term "wide gate pitch" as used herein defines a gate pitch wider than 1×CPP of the semiconductor device, i.e., 1.5×CPP, 2×CPP or greater.

Embodiments of the present disclosure are now described in detail with accompanying drawings. It is noted that like and corresponding elements are referred to by the use of the same reference numerals. However, it is noted that specific elements may be denoted by a reference numeral and a subscript, for example 104a, 208b, etc. When those elements are referred to generically, merely the reference numerals are used, for example 104, 208, etc.

Figure 1B:
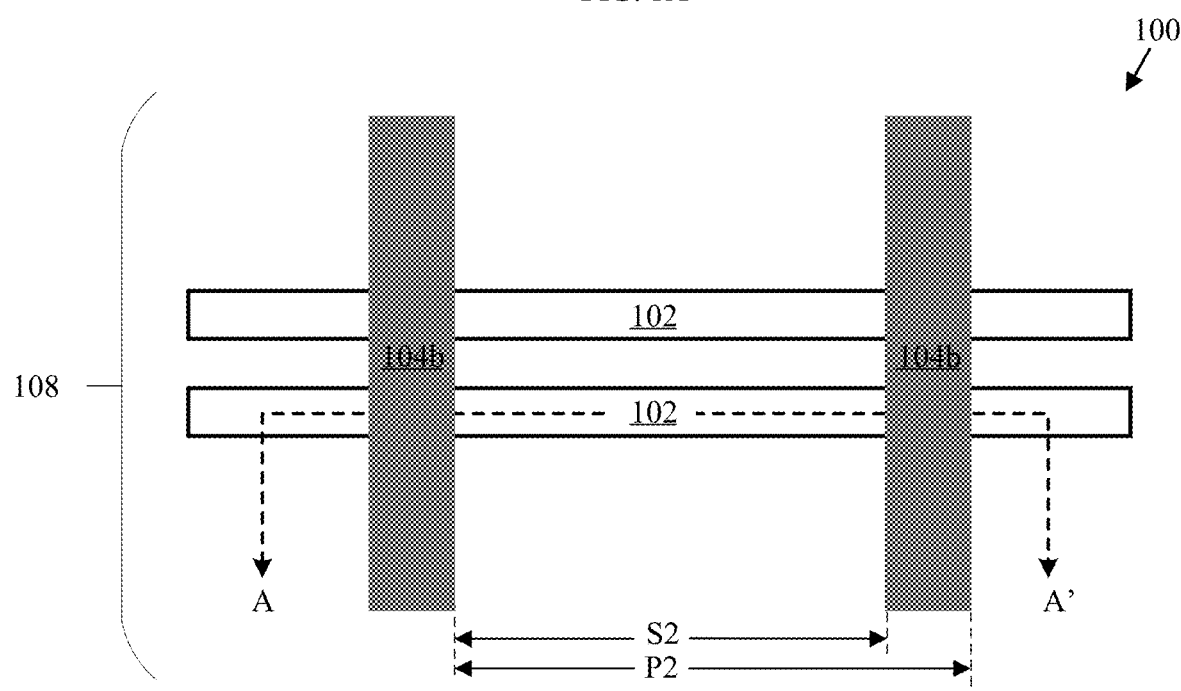

FIGS. 1A-1B are simplified top views of a semiconductor device 100 having different gate pitches, according to embodiments of the disclosure. The semiconductor device 100 includes an array of active regions 102 and an array of gate structures 104 traversing across the array of active regions 102.

As illustrated in FIG. 1A, the semiconductor device 100 includes a first device region 108 having a gate pitch P1 between the gate structures 104a, with corresponding gate-to-gate spacing S1. In this embodiment of the disclosure, the gate pitch P1 has a width that is equal to the CPP of the semiconductor device 100, with a corresponding minimum gate-to-gate spacing of the semiconductor device 100.

As illustrated in FIG. 1B, the semiconductor device 100 further includes a second device region 110 having a gate pitch P2 between the gate structures 104b, with corresponding gate-to-gate spacing S2. In this embodiment of the disclosure, the gate pitch P2 has a width wider than the CPP of the semiconductor device 100. Specifically, the gate pitch P2 has a width that is equal to 2×CPP of the semiconductor device 100. Accordingly, the second device region 110 has a lower pattern density than the first device region 108.

It is understood that there may be other gate structures having different gate pitch formed on different regions of the semiconductor device. For example, the different gate pitch may include widths of 1.5×CPP, 3×CPP or greater. Those gate structures are not shown in the accompanying drawings.

Those skilled in the art would recognize that the number and placement locations of the active regions 102 and the gate structures 104 may vary according to the specific designs of the semiconductor devices. Furthermore, it is understood that even though the active regions 102 are represented as fins in the accompanying drawings, the fin is used only as a non-limiting example of the active region, and other active regions (e.g., a doped layer on a top surface of a bulk semiconductor substrate or a semiconductor-on-insulator layer) may be used as well.

FIGS. 2A-2I are cross-sectional views of a partially processed semiconductor device 200 (taken along a similar line A-A' as indicated in FIG. 1B), illustrating a method of forming multiple semiconductor structures in a wide gate pitch region, according to embodiments of the disclosure.

Figure 2A:
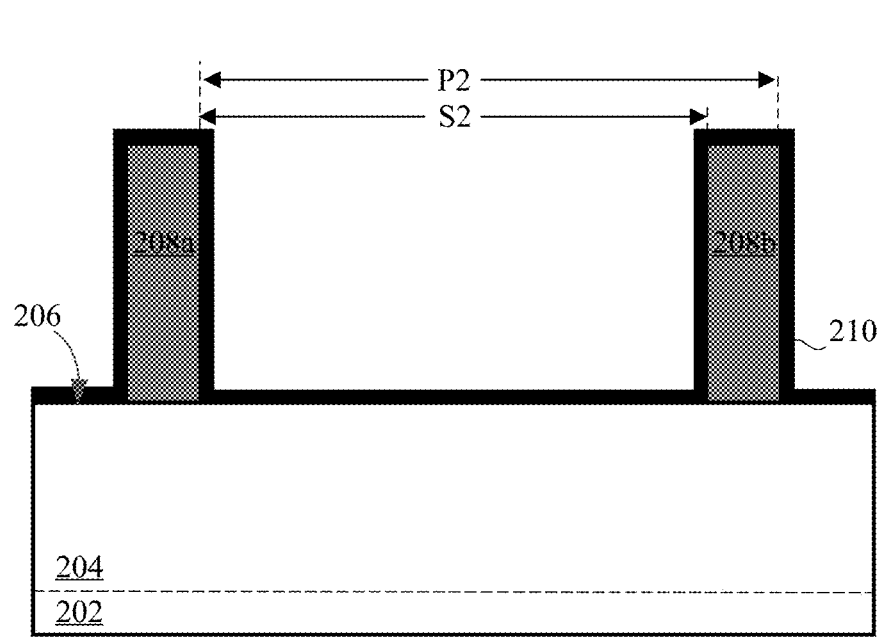
FIGS. 2A-2I is a cross-sectional view of a partially processed semiconductor device (taken along a similar line A-A' as indicated in FIG. 1), illustrating a method of forming multiple semiconductor structures in a wide gate pitch region, according to embodiments of the disclosure.

As illustrated in FIG. 2A, the semiconductor device 200 includes a semiconductor substrate 202 and an active region 204 over the substrate 202. The active region 204 is typically formed of the same semiconductor material as the substrate 202 and an arbitrary intersection between the substrate 202 and the active region 204 is demarcated by a dashed line. The active region 204 has a top surface 206. The semiconductor substrate 202 may include of any suitable semiconductor material, such as silicon, silicon germanium, silicon carbon, other II-VI or III-V semiconductor compounds and the like. In one embodiment of the disclosure, the semiconductor material of the substrate 202 is preferably silicon.

Gate stacks 208 are formed over the top surface 206 of the active region 204. The gate stacks 208 are separated by a gate pitch P2, with a corresponding gate-to-gate spacing S2 between the gate stacks 208. In one embodiment of the disclosure, the gate stacks 208 may include a dummy gate structure, a gate insulating layer and a gate cap, fabricated by a gate-last fabrication process. In an alternative embodiment of the disclosure, the gate stacks 208 may include a metal gate structure fabricated by a gate-first fabrication process.

A dielectric liner 210 is conformally deposited over the top surface 206 of the active region 204 and the gate stacks 208 using a suitable deposition process, such as a chemical vapor deposition (CVD) process. The dielectric liner 210 is preferably formed of a low-k dielectric material, i.e., a dielectric material having a low dielectric constant, to at least contribute to electrically isolate the gate stacks 208 from adjacent conductive structures. The dielectric liner 210 may include silicon nitride, silicon oxide or other suitable low-k dielectric material having any suitable thickness. In one embodiment of the disclosure, the dielectric liner 210 is preferably silicon nitride.

Figure 2B:
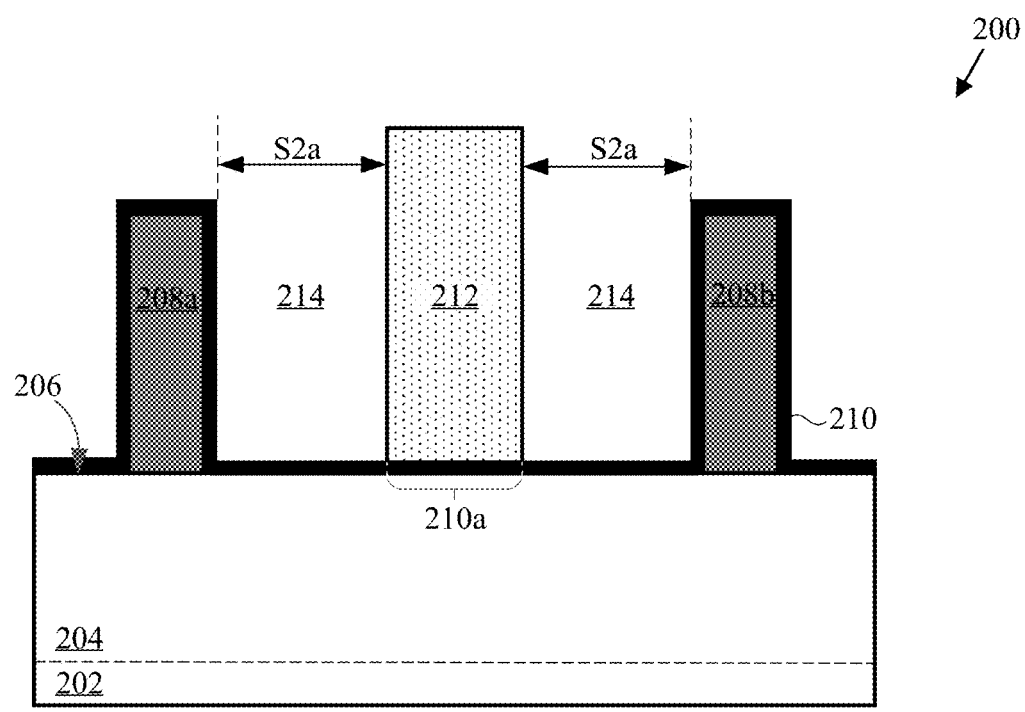

FIG. 2B illustrates the semiconductor device 200 after depositing a patterning layer (not shown) and forming openings 214 in the patterning layer, according to an embodiment of the disclosure. The patterning layer is deposited over the dielectric liner 210 and the openings 214 are formed in the patterning layer using suitable deposition and lithographic processes. A masking portion 212 of the patterning layer is selectively covering a portion of the dielectric liner 210a between the gate stacks 208. The patterning layer may include a hard mask layer, a photoresist layer, or any suitable patterning layer having any suitable thickness. The patterning layer may also include a multi-layer stack of patterning materials.

Conventionally, the patterning layer exposes a region, e.g., PMOS device region, on the semiconductor device and serves as a protective layer for the other regions, e.g., NMOS device region, of the semiconductor device. Instead of exposing the entire PMOS device region, the lithographic mask may be modified to further selectively cover the portions of the PMOS device region, i.e., portions of the dielectric liner between the gate stacks for the PMOS device. No additional lithographic mask is required to selectively cover the portion of the dielectric liner.

In this embodiment of the disclosure, the gate stacks 208 and the masking portion 212 is separated by a gate-to-patterning layer spacing S2a. The gate-to-patterning layer spacing S2a has a width substantially equal to the minimum gate-to-gate spacing of the semiconductor device 200.

It will be appreciated by those skilled in the art that the width of the masking portion 212 may be adjusted to a predetermined width to form the openings 214 in the patterning layer such that each of the openings 214 has a width substantially equal to the minimum gate-to-gate spacing of the semiconductor device 200. Although not shown, if required, more than two openings 214 may be formed between the gate stacks 208, as long as the each of the openings 214 has a width substantially equal to the minimum gate-to-gate spacing of the semiconductor device 200.

Figure 2C:
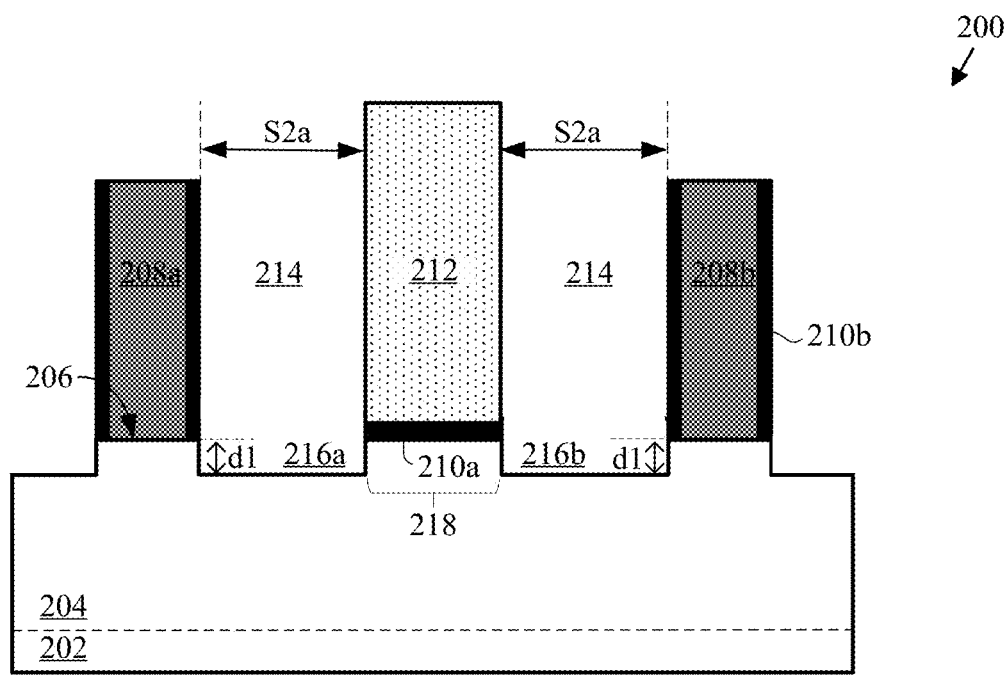

FIG. 2C illustrates the semiconductor device 200 after forming recessed regions 216 in the active region 204, according to an embodiment of the disclosure. Using the gate stacks 208 and the masking portion 212 as masking features, the recessed regions 216 are formed adjacent to the gate stacks 208 by removing material from the active region 204 using a suitable material removing process. Specifically, a recessed region 216a is formed between the gate stack 208a and the masking portion 212 and a recessed region 216b is formed between the gate stack 208b and the masking portion 212. The formed recessed regions 216 are substantially uniform, each having a recessed depth d1 below the top surface 206 of the active region 204 and a width substantially equal to the gate-to-patterning layer spacing S2a of the semiconductor device 200. Active region surfaces are exposed in the recessed regions 216. In one embodiment of the disclosure, the material removing process employed to form the recessed regions 216 is preferably an anisotropic dry etching process, such as a reactive ion etching (ME) process.

An elevated section 218 of the active region 204 is correspondingly formed during the formation of the recessed regions 216. Specifically, the elevated section 218 is formed under the masking portion 212 between the recessed regions 216a and 216b. The elevated section 218 has a height corresponding to the recessed depth d1.

Portions of the dielectric liner 210 are consequently removed during the material removing process, with a portion of the dielectric liner 210b remaining on sidewalls of the gate stack 208, along with the portion of dielectric liner 210a covered by the masking portion 212 over the elevated section 218. In this embodiment of the disclosure, the dielectric liner 210b forms gate spacers for the gate stacks 208.

Figure 2D:
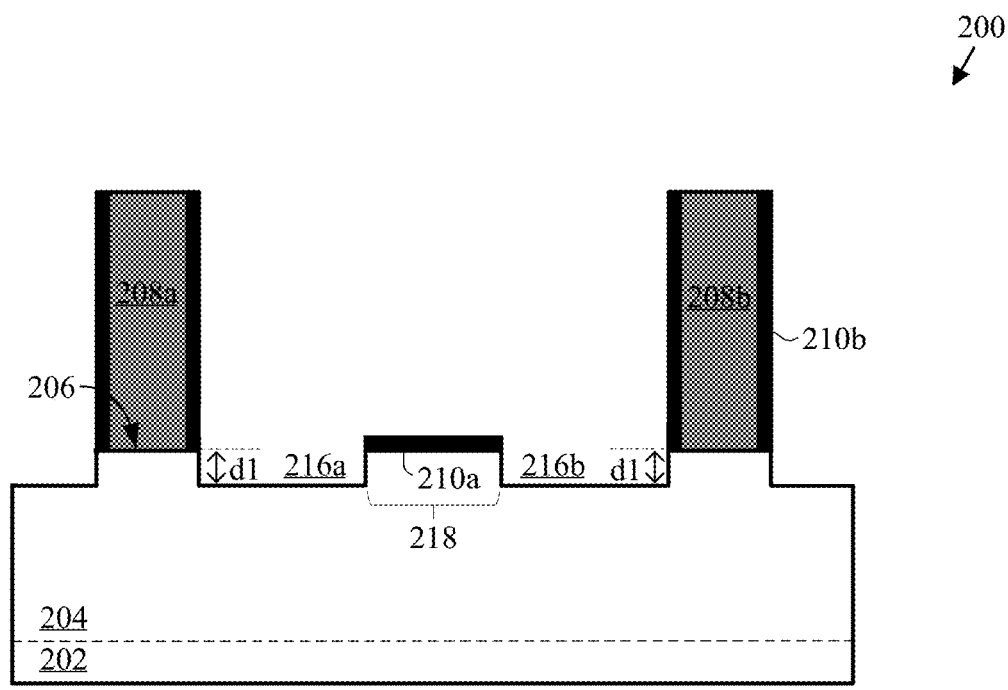

FIG. 2D illustrates the semiconductor device 200 after removing the masking portion 212, according to an embodiment of the disclosure. The masking portion 212 may be removed using a suitable material removing process. The dielectric liner 210a, which is previously covered by the masking portion 212, is exposed after the material removing process. The material removing process employed to remove the masking portion 212 may include a dry plasma ashing process, a selective wet etching process or other suitable material removing processes.

Figure 2E:
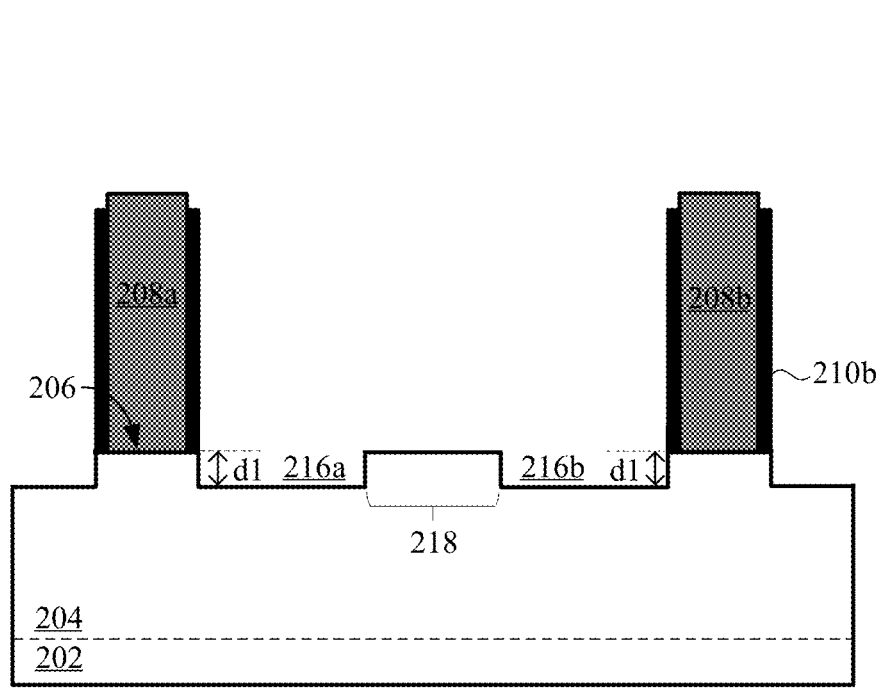

FIG. 2E illustrates the semiconductor device 200 after removing the dielectric liner 210a, according to an embodiment of the disclosure. The dielectric liner 210a is removed using a suitable material removing process. Portions of the dielectric liner 210b at top portions of the gate stacks 208 are also removed in the same process. In one embodiment of the disclosure, the material removing process employed to selectively remove the dielectric liner 210a is preferably an anisotropic dry etching process, such as a reactive ion etching (RIE) process.

Figure 2F:
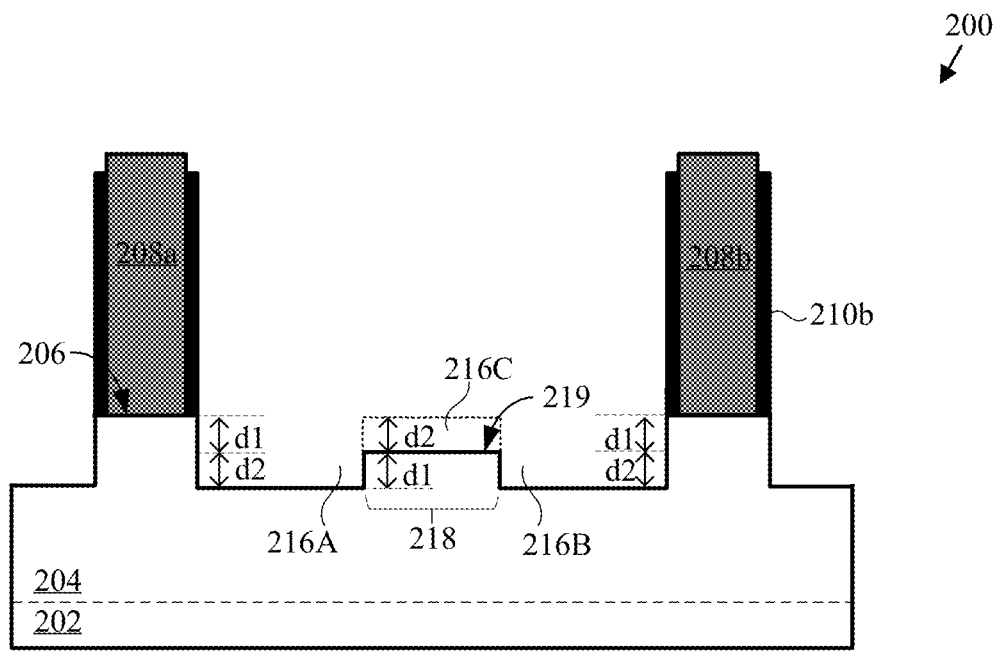

FIG. 2F illustrates the semiconductor device 200 after extending the recessed regions 216a and 216b into the active region 204, according to an embodiment of the disclosure. Using a suitable material removing process, the recessed regions 216a and 216b are further recessed into the active region 204 by a depth d2 to form recessed regions 216A and 216B, respectively. The recessed regions 216A and 216B are substantially uniform, each having a recessed depth (d1+d2).

The elevated section 218 is also recessed by the depth d2 to form a recessed region 216C. The elevated section 218 has a top surface 219 at a level below the top surface 206 of the active region 204. The removed portion of the elevated section 218 is demarcated by a dotted line. The recessed region 216C has a depth d2. The recessed region 216C has less exposed active region surfaces than that of the recessed regions 216A and 216B. The elevated section 218 advantageously provides additional surface planes in the active region 204 for semiconductor material to grow, thereby increasing the local pattern density in that region to eliminate, or at least reduce, the pattern loading effect during the subsequent formation of the semiconductor structures.

Figure 2G:
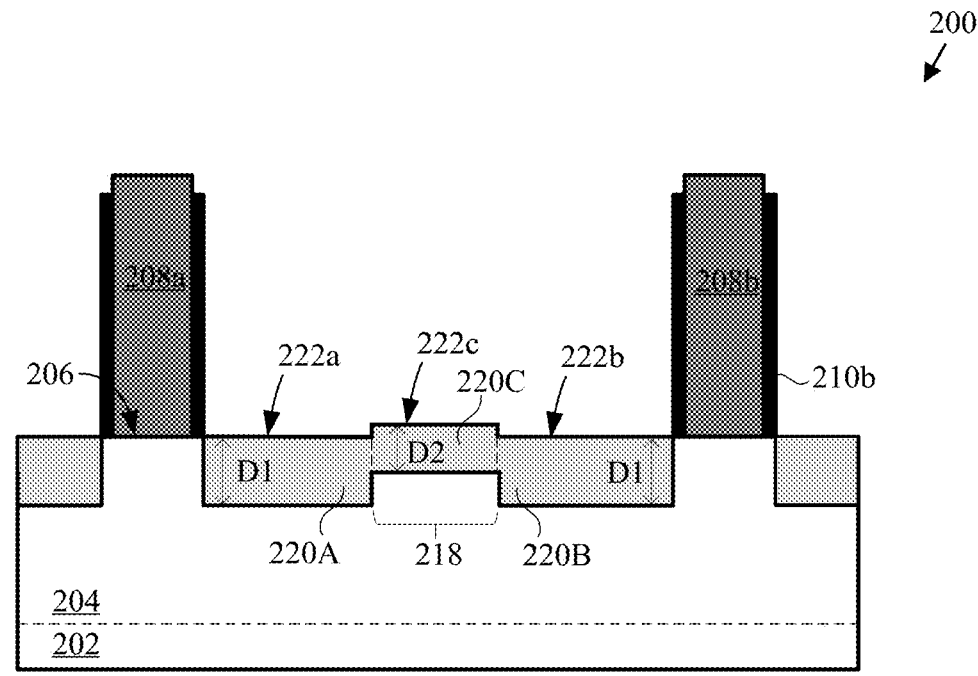

FIG. 2G illustrates the semiconductor device 200 after forming semiconductor structures 220 in the recessed regions 216 using a suitable epitaxy process, according to an embodiment of the disclosure. The semiconductor device 200 may be subjected to a suitable cleaning process prior to performing the epitaxy process. The cleaning process may be performed using a variety of etchants or cleaning agents, such as a dilute hydrofluoric acid. The cleaning process may remove any undesirable oxide material formed as a result of natural oxidation of exposed active region surfaces in the recessed regions 216.

The epitaxy process employed to form the semiconductor structures 220 may include a vapor-phase epitaxy process, a liquid-phase epitaxy process, a solid-phase epitaxy process or other suitable epitaxy processes. The semiconductor structures 220 may be formed by selectively growing a semiconductor material over certain surfaces, e.g., over semiconductor surfaces, while other surfaces remain substantially free of the semiconductor material. Selective growth of semiconductor material has known techniques in the art.

In this embodiment of the disclosure, the semiconductor material is grown to at least fill the recessed regions 216A and 216B. Since the recessed regions 216A and 216B are substantially uniform, the recessed regions 216A and 216B are expected to be filled in a similar period of time. The elevated section 218 has less exposed active region surfaces than the recessed regions 216A and 216B, and therefore a less amount of semiconductor material is expected to be grown in the same period of time. A semiconductor structure 220A is formed in the recessed region 216A and a semiconductor structure 220B is formed in the recessed region 216B. The semiconductor structures 220A and 220B have a width substantially equal to the minimum gate-to-gate spacing of the semiconductor device 200. A semiconductor structure 220C is formed in the recessed region 216C. The semiconductor structure 220C forms a semiconductor bridge over the elevated section 218, electrically coupling the semiconductor structures 220A and 220B.

In some embodiments, the semiconductor structures 220A and 220B have top surfaces 222a and 222b, respectively, substantially coplanar with the top surface 206 of the active region 204. The semiconductor structure 220C has a top surface 222c, potentially at a level above the top surface 206 of the active region 204. The semiconductor structures 220A and 220B have a thickness D1 and the semiconductor structure 220C has a thickness D2. The thickness D2 of the semiconductor structure 220C is shallower than the thickness D1 of the semiconductor structures 220A and 220B.

The semiconductor material used to grow the semiconductor structures 220 may include silicon, silicon phosphorous, silicon phosphorous carbide, and/or other suitable combinations. In some embodiments of the disclosure, the semiconductor material is preferably a silicon-rich material. In one embodiment of the disclosure where an NMOS device is desired, the semiconductor structures 220 may include epitaxially-grown silicon. In another embodiment of the disclosure, where a PMOS device is desired, the semiconductor structures 220 may include epitaxially-grown silicon germanium.

Figure 2H:
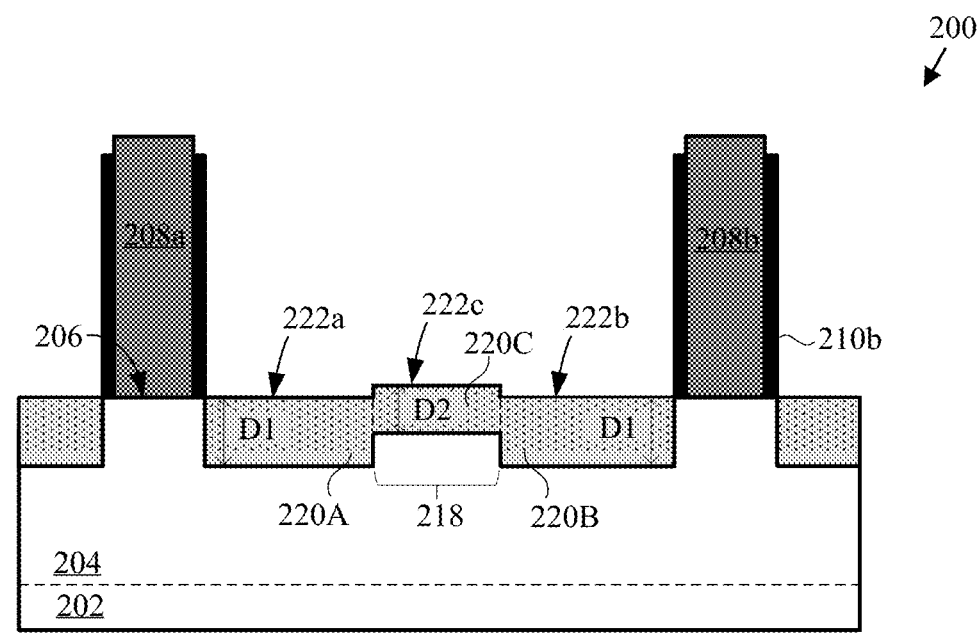

FIG. 2H illustrates the semiconductor device 200 after a suitable doping process to form a source or a drain region for the semiconductor device 200, according to an embodiment of the disclosure. The doping process may use any suitable dopants to obtain the desired dopant concentration. The semiconductor structures 220 may or may not be fully doped with dopants. In some embodiments of the disclosure, at least upper portions of the semiconductor structures 220 are doped with the dopants.

In one embodiment of the disclosure, the semiconductor structures 220 may be doped with N-type donors to form NMOS device regions. The N-type donors may include phosphorus, arsenic, antimony, and/or other suitable dopants. In another embodiment of the disclosure, the semiconductor structures 220 may be doped with P-type acceptors during the epitaxy process to form PMOS device regions. The P-type acceptors may include boron, aluminum, gallium, indium, and/or other suitable dopants. In an alternative embodiment of the disclosure, the semiconductor structures 220 may be left undoped.

One or more annealing processes may be performed to activate the PMOS and NMOS device regions. The annealing processes may include rapid thermal annealing (RTA) process, laser annealing process or other suitable annealing processes.

Additional process steps may be performed before, during or after forming the semiconductor structures, such as forming one or more patterning layers and/or dielectric layers as protection layers for regions that will not be doped. For example, when forming semiconductor structures in a PMOS device, one or more patterning layers and dielectric layers may be formed on an NMOS device as protection layers using suitable deposition processes.

Figure 2I:
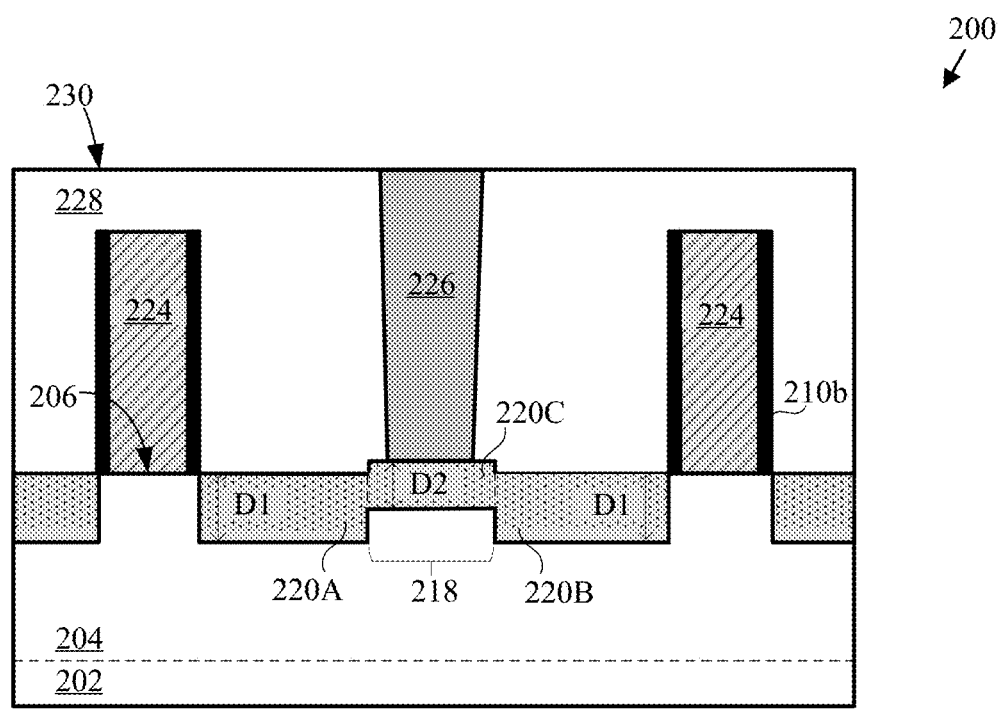

FIG. 2I illustrates the semiconductor device 200 after performing additional process steps to form replacement gate structures 224 and a contact structure 226, according to an embodiment of the disclosure. The contact structure 226 is formed over and electrically couples the semiconductor structures 220 between the replacement gate structures 224. The electrical resistance between the contact structure 226 and the semiconductor structures 220 are advantageously kept low as the contact structure 226 fully lands on the semiconductor structures 220. The process steps may include one or more deposition process operations to form gate insulating layer(s) (e.g., silicon dioxide, hafnium oxide, or a layer of high-k dielectric material having a dielectric constant of typically 10 or greater, etc.) and conductive layer(s) (e.g., seed layers, work function layers or fill layers, etc.) that will be part of the gate electrode of the replacement gate structure 224. The gate insulating layers and the conductive layers are not separately shown in the accompanying drawings.

The contact structure 226 is formed over and electrically coupling the semiconductor structures 220 using known semiconductor fabrication processes, including the following exemplary process. An insulating layer 228 is deposited over the replacement gate structures 224 and the semiconductor structures 220 using a suitable deposition process. A contact opening (not shown) is formed in the insulating layer 228 and over the semiconductor structures 220, using suitable patterning processes. The contact opening is preferably equidistant from adjacent replacement gate structures 224.

A conductive material is deposited in the contact opening using a suitable deposition process. The conductive material may include tungsten, copper, aluminum, alloys of these metals and/or combinations thereof. In this embodiment of the disclosure, the contact structure is preferably formed of tungsten. The conductive material may overfill the opening and a suitable planarization process may be performed to form a top surface substantially coplanar with a top surface of the insulating layer 230.

Although not shown in FIG. 2I, one or more liners may be deposited during the formation of the contact structure 226. For instance, an adhesion liner and/or a barrier liner may be deposited in the contact opening before the conductive material deposition. The adhesion liner may include metal silicides, such as titanium silicide, nickel silicide or other suitable adhesion material having any suitable thickness. The barrier liner may include metal nitrides, such as titanium nitride, tantalum nitride or other suitable barrier material having any suitable thickness.

It is understood that the semiconductor devices 200 may undergo further processing to form various semiconductor features known in the art. For example, gate contacts may be formed in the insulating layer 228 to electrically couple the replacement gate structures 224 to other regions of the semiconductor device 200, e.g., back-end-of-line (BEOL) region of the semiconductor device 200. The BEOL region typically includes a plurality of conductive lines and interconnect vias that are routed, as needed, across the semiconductor device 200.

FIGS. 3A-3J are cross-sectional views of a partially processed semiconductor device 300 (taken along a similar line A-A' as indicated in FIG. 1), illustrating a method of forming multiple semiconductor structures in a wide gate pitch, according to alternative embodiments of the disclosure.

Figure 3A:
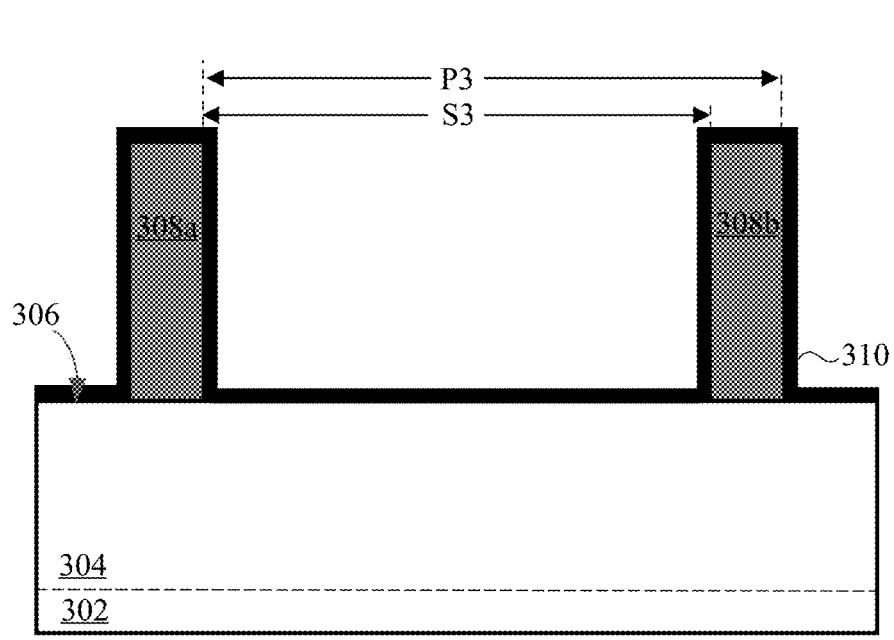
FIGS. 3A-3J are cross-sectional views of a partially processed semiconductor device (taken along a similar line A-A' as indicated in FIG. 1), illustrating a method of forming multiple semiconductor structures in a wide gate pitch region, according to alternative embodiments of the disclosure.

As illustrated in FIG. 3A, the semiconductor device 300 includes a semiconductor substrate 302 and an active region 304 over the substrate 302. The active region 304 is typically formed of the same semiconductor material as the substrate 302 and an arbitrary intersection between the substrate 302 and the active region 304 is demarcated by a dashed line. The active region 304 has a top surface 306. The semiconductor substrate 302 may include of any suitable semiconductor material, such as silicon, silicon germanium, silicon carbon, other II-VI or III-V semiconductor compounds and the like. In one embodiment of the disclosure, the semiconductor material of the substrate 302 is preferably silicon.

Gate stacks 308 are formed over the top surface 306 of the active region 304. The gate stacks 308 are separated by a gate pitch P3, with a corresponding gate-to-gate spacing S3 between the gate stacks 308. In one embodiment of the disclosure, the gate stacks 308 may include a dummy gate structure, a gate insulating layer and a gate cap, fabricated by a gate-last fabrication process. In an alternative embodiment of the disclosure, the gate stacks 308 may include a metal gate structure fabricated by a gate-first fabrication process.

A dielectric liner 310 is conformally deposited over the top surface 306 of the active region 304 and the gate stacks 308 using a suitable deposition process, such as a chemical vapor deposition (CVD) process. The dielectric liner 310 is preferably formed of a low-k dielectric material, i.e., a dielectric material having a low dielectric constant, to at least contribute to electrically isolate the gate stacks 308 from adjacent conductive structures. The dielectric liner 310 may include silicon nitride, silicon oxide or other suitable low-k dielectric material having any suitable thickness. In one embodiment of the disclosure, the dielectric liner 310 is preferably silicon nitride.

Figure 3B:
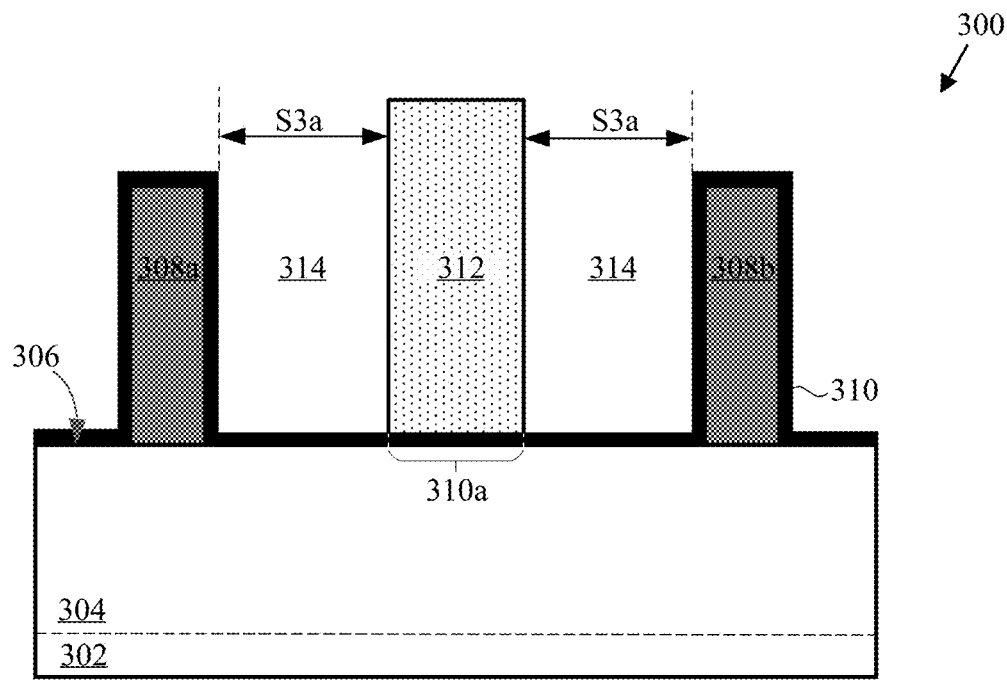

FIG. 3B illustrates the semiconductor device 300 after depositing a patterning layer (not shown) and forming openings 314 in the patterning layer, according to an embodiment of the disclosure. The patterning layer is deposited over the dielectric liner 310 and the openings 314 are formed in the patterning layer using suitable deposition and lithographic processes. A masking portion 312 of the patterning layer is selectively covering a portion of the dielectric liner 310a between the gate stacks 308. The patterning layer may include a hard mask layer, a photoresist layer, or any suitable patterning layer having any suitable thickness. The patterning layer may also include a multi-layer stack of patterning materials.

Conventionally, the patterning layer exposes a region, e.g., PMOS device region, on the semiconductor device and serves as a protective layer for the other regions, e.g., NMOS device region, of the semiconductor device. Instead of exposing the entire PMOS device region, the lithographic mask may be modified to further selectively cover the portions of the PMOS device region, i.e., portions of the dielectric liner between the gate stacks for the PMOS device. No additional lithographic mask is required to selectively cover the portion of the dielectric liner.

In this embodiment of the disclosure, the gate stacks 308 and the masking portion 312 is separated by a gate-to-patterning layer spacing S3a. The gate-to-patterning layer spacing S3a has a width substantially equal to the minimum gate-to-gate spacing of the semiconductor device 300.

It will be appreciated by those skilled in the art that the width of the masking portion 312 may be adjusted to a predetermined width to form the openings 314 in the patterning layer such that each of the openings 314 has a width substantially equal to the minimum gate-to-gate spacing of the semiconductor device 300. Although not shown, if required, more than two openings 314 may be formed between the gate stacks 308, as long as the each of the openings 314 has a width substantially equal to the minimum gate-to-gate spacing of the semiconductor device 300.

Figure 3C:
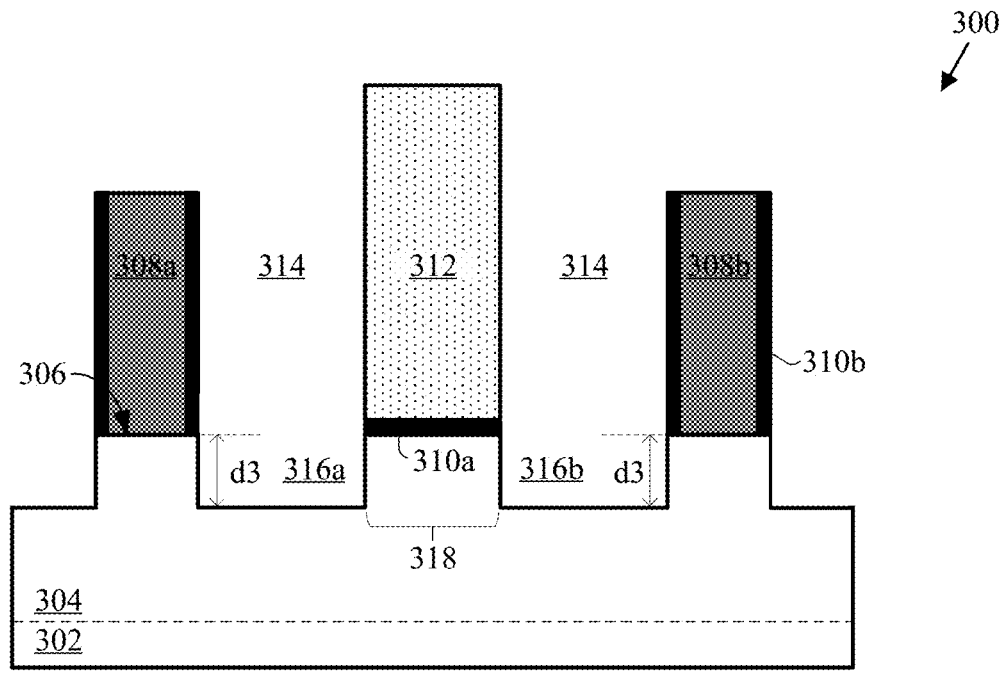

FIG. 3C illustrates the semiconductor device 300 after forming recessed regions 316 in the active region 304, according to an embodiment of the disclosure. Using the gate stacks 308 and the masking portion 312 as masking features, the recessed regions 316 are formed adjacent to the gate stacks 308 by removing material from the active region 304 using a suitable material removing process. Specifically, a recessed region 316a is formed between the gate stack 308a and the masking portion 312 and a recessed region 316b is formed between the gate stack 308b and the masking portion 312. The formed recessed regions 316 are substantially uniform, each having a recessed depth d3 below the top surface 306 of the active region 304 and a width substantially equal to the gate-to-patterning layer spacing S3a of the semiconductor device 300. Active region surfaces are exposed in the recessed regions 316. In one embodiment of the disclosure, the material removing process employed to form the recessed regions 316 is preferably an anisotropic dry etching process, such as a reactive ion etching (ME) process.

An elevated section 318 of the active region 304 is correspondingly formed during the formation of the recessed regions 316. Specifically, the elevated section 318 is formed under the masking portion 312 between the recessed regions 316a and 316. The elevated section 318 has a height corresponding to the recessed depth d3.

Portions of the dielectric liner 310 are consequently removed during the material removing process, with a portion of the dielectric liner 310b remaining on sidewalls of the gate stack 308, along with the portion of the dielectric liner 310a covered by the masking portion 312 over the elevated section 318. In this embodiment of the disclosure, the dielectric liner 310b forms gate spacers for the gate stacks 308.

Figure 3D:
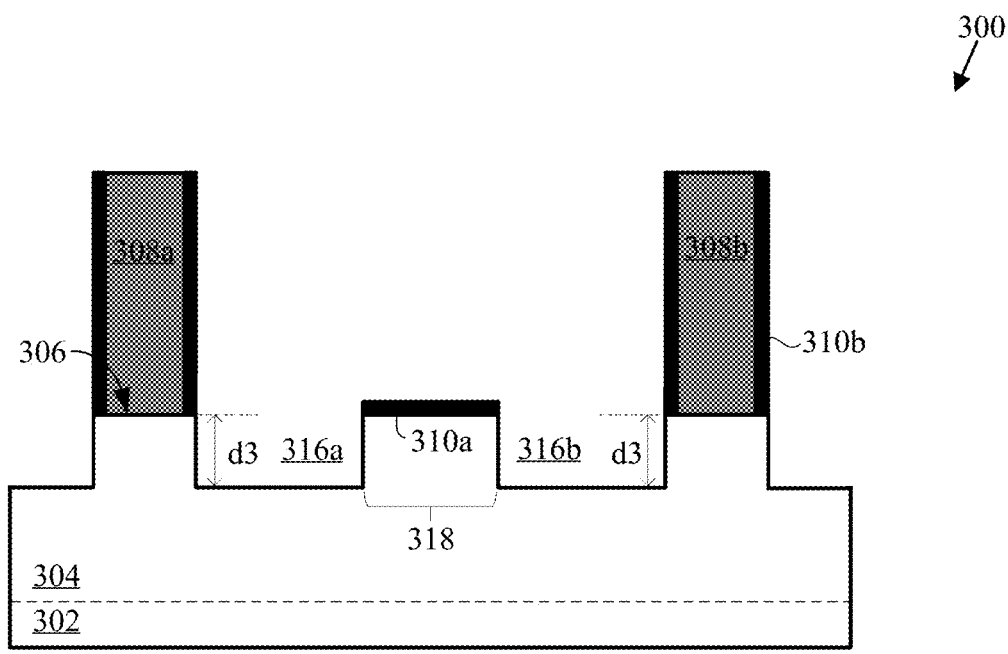

FIG. 3D illustrates the semiconductor device 300 after removing the masking portion 312, according to an embodiment of the disclosure. The masking portion 312 may be removed using a suitable material removing process. The dielectric liner 310a, which is previously covered by the masking portion 312, is exposed after the material removing process. The material removing process employed to remove the masking portion 312 may include a dry plasma ashing process, a selective wet etching process or other suitable material removing processes.

Figure 3E:
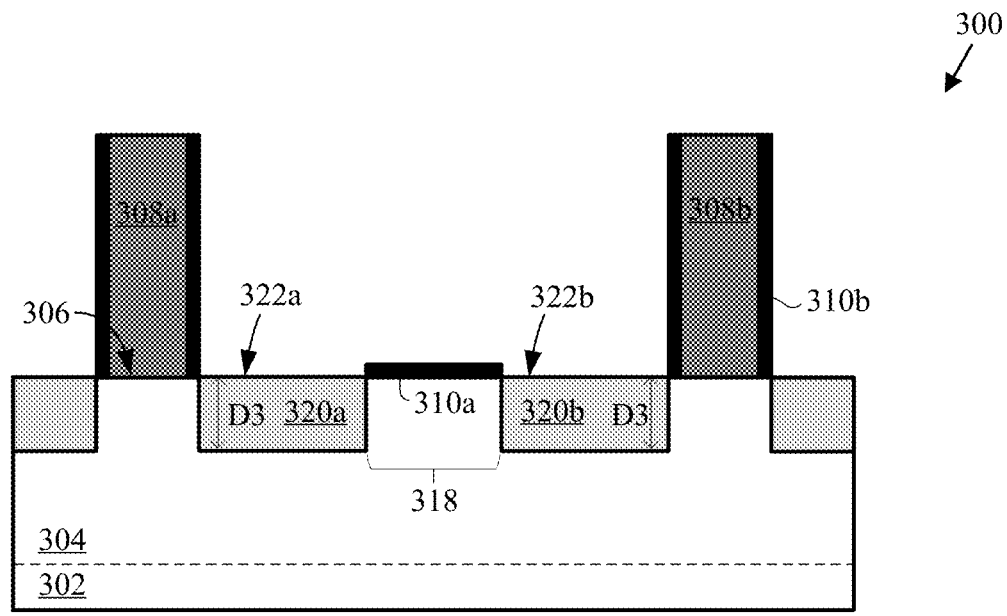

FIG. 3E illustrates the semiconductor device 300 after forming semiconductor structures 320 in the recessed regions 316 using a suitable epitaxy process, according to an embodiment of the disclosure. The semiconductor device 300 may be subjected to a suitable cleaning process prior to performing the epitaxy process. The cleaning process may be performed using a variety of etchants or cleaning agents, such as a dilute hydrofluoric acid. The cleaning process may remove any undesirable oxide material formed as a result of natural oxidation of exposed active region surfaces in the recessed regions 316.

The epitaxy process employed to form the semiconductor structures 320 may include a vapor-phase epitaxy process, a liquid-phase epitaxy process, a solid-phase epitaxy process or other suitable epitaxy processes. The semiconductor structures 320 may be formed by selectively growing a semiconductor material over certain surfaces, e.g., over semiconductor surfaces, while other surfaces remain substantially free the semiconductor material. Selective growth of the semiconductor material has known techniques in the art.

The semiconductor material is grown to fill the recessed regions 316. A semiconductor structure 320a is formed in the recessed region 316a and a semiconductor structure 320b is formed in the recessed region 316b. The semiconductor structures 320a and 320b have a width substantially equal to the minimum gate-to-gate spacing of the semiconductor device 300. In some embodiments, the semiconductor structures 320a and 320b have top surfaces 322a and 322b, respectively, substantially coplanar with the top surface 306 of the active region 304. The semiconductor structures 320 have a thickness D3.

The semiconductor material used to grow the semiconductor structures 320 may include silicon, silicon phosphorous, silicon phosphorous carbide, and/or other suitable combinations. In some embodiments of the disclosure, the semiconductor material is preferably a silicon-rich material. In one embodiment of the disclosure where an NMOS device is desired, the semiconductor structures 320 may include epitaxially-grown silicon. In another embodiment of the disclosure, where a PMOS device is desired, the semiconductor structures 320 may include epitaxially-grown silicon germanium.

Figure 3F:
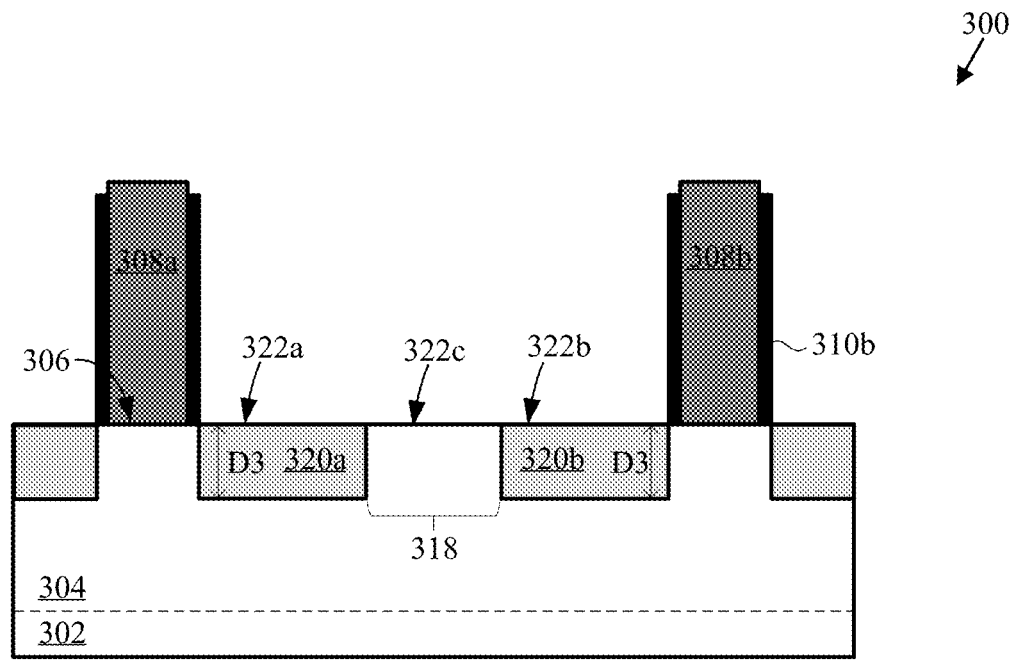

FIG. 3F illustrates the semiconductor device 300 after removing the dielectric liner 310a, according to an embodiment of the disclosure. The dielectric liner 310a is removed using a suitable material removing process. Portions of the dielectric liner 310b at top portions of the gate stacks 308 are also removed in the same process, exposing a top surface 322c of the elevated section 318. In one embodiment of the disclosure, the material removing process employed to selectively remove the dielectric liner 310a is preferably an anisotropic dry etching process, such as a reactive ion etching (ME) process.

Figure 3G:
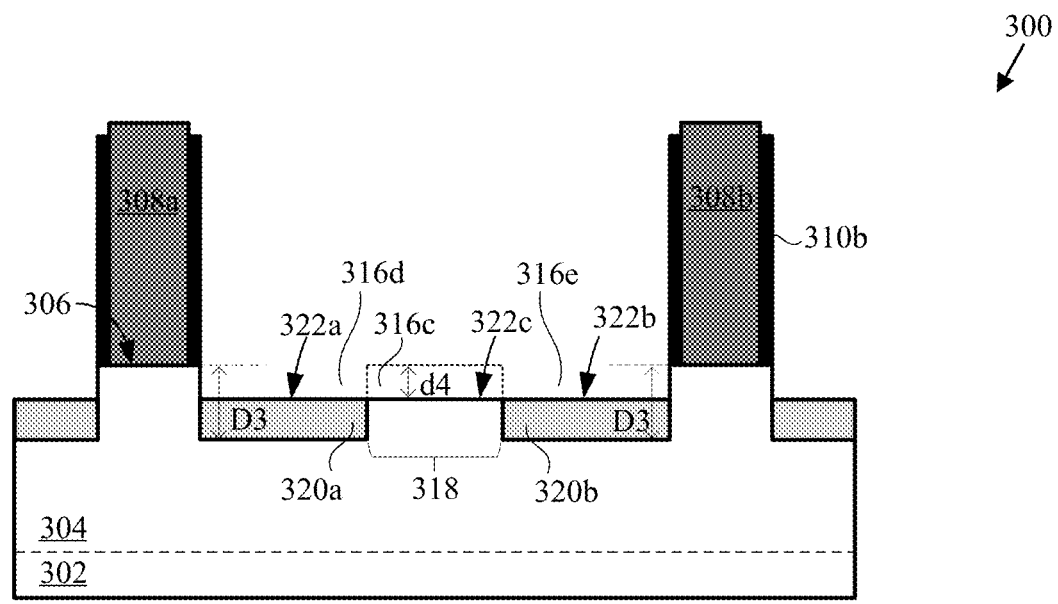

FIG. 3G illustrates the semiconductor device 300 after recessing the semiconductor structures 320 and the elevated section 318, according to an embodiment of the disclosure. The semiconductor structures 320 and the elevated section 318 are recessed by a depth d4 below the top surface 306 of the active region 304, using a suitable material removing process. Recessed regions 316d and 316e are formed over the semiconductor structures 320a and 320b, respectively, and a recessed region 316c is formed over the elevated section 318. The removed portion of the elevated section 318 is demarcated by a dotted line. The top surface 322c of the elevated section 318 provides advantageously provides an additional surface plane between the gate structures 308 for the semiconductor material to grow, thereby increasing the local pattern density in that region to eliminate, or at least reduce, the pattern loading effect during the subsequent formation of the semiconductor structures.

In one embodiment of the disclosure, the material removing process employed to recess the semiconductor structures 320 and the elevated section 318 is preferably an anisotropic dry etching process, such as a reactive ion etching (RIE) process. In another embodiment of the disclosure, the depth d4 is preferably in the range of about 10 nm to 20 nm.

As the semiconductor material of the elevated section 318 and the semiconductor material of the semiconductor structures 320 are predominantly silicon-rich materials, the semiconductor structures 320 and the elevated section 318 are expected to be recessed at a substantially similar rate. The recessed semiconductor structures 320a and 320b and the elevated section 318 have substantially coplanar top surfaces 322a, 322b and 322c, respectively, at a level below the top surface of the active region 304.

Figure 3H:
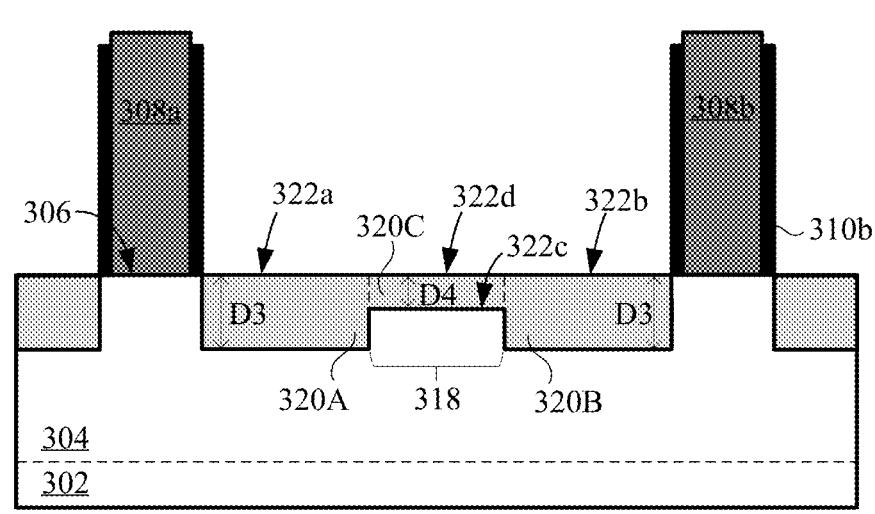

FIG. 3H illustrates the semiconductor device 300 after forming semiconductor structures 320A, 320B, and 320C using a suitable epitaxy process, according to an embodiment of the disclosure. Semiconductor material is grown in the recessed regions 316d and 316e to form the semiconductor structures 320A and 320B, respectively. In this embodiment of the disclosure, the top surfaces 322a and 322b of the semiconductor structures 320A and 320B, respectively, are preferably substantially coplanar with the top surface 306 of the active region 304, and the semiconductor structures 320A and 320B have a thickness D3. The semiconductor material is preferably the same semiconductor material as the semiconductor structures 320a and 320b formed in FIG. 3E.

The semiconductor material likewise fills the recessed region 316c to form a semiconductor structure 320C having a thickness D4. In this embodiment, the semiconductor structure 320C has a top surface 322d substantially coplanar with the top surface 306 of the active region 304. Alternatively, the top surface 322d of the semiconductor structure 320C may be at a level above the top surface 306 of the active region 304. The semiconductor structure 320C forms a semiconductor bridge electrically coupling the semiconductor structures 320A and 320B. The thickness D4 of the semiconductor structure 320C is shallower than the thickness D3 of the semiconductor structures 320A and 320B.

Figure 3I:
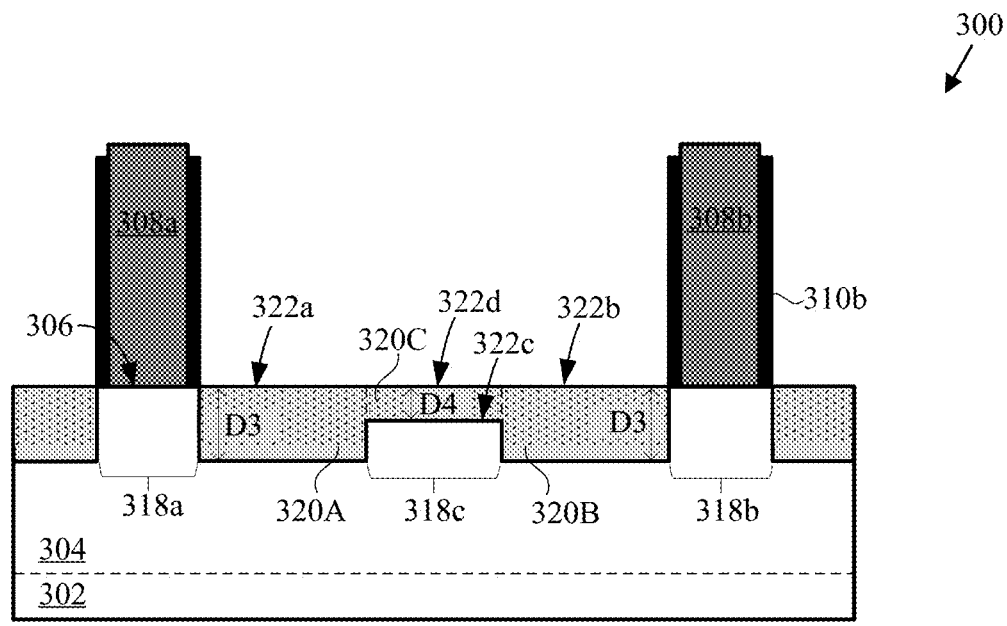

FIG. 3I illustrates the semiconductor device 300 after a suitable doping process to form a source or a drain region for the semiconductor device 300, according to an embodiment of the disclosure. The doping process may use any suitable dopants to obtain the desired dopant concentration. The semiconductor structures 320 may or may not be completely doped with dopants. In some embodiments of the disclosure, at least upper portions of the semiconductor structures 320 are doped with the dopants.

In one embodiment of the disclosure, the semiconductor structures 320 may be doped with N-type donors to form NMOS device regions. The N-type donors may include phosphorus, arsenic, antimony, and/or other suitable dopants. In another embodiment of the disclosure, the semiconductor structures 320 may be doped with P-type acceptors during the epitaxy process to form PMOS device regions. The P-type acceptors may include boron, aluminum, gallium, indium, and/or other suitable dopants. In an alternative embodiment of the disclosure, the semiconductor structures 320 may be left undoped.

One or more annealing processes may be performed to activate the PMOS and NMOS device regions. The annealing processes may include rapid thermal annealing (RTA) process, laser annealing process or other suitable annealing processes. Additional process steps may be performed before, during or after forming the semiconductor structures, such as forming one or more patterning layers and/or dielectric layers as protection layers for regions that will not be doped. For example, when forming semiconductor structures in a PMOS device, one or more patterning layers and dielectric layers may be formed on an NMOS device as protection layers using suitable deposition processes.

Figure 3J:
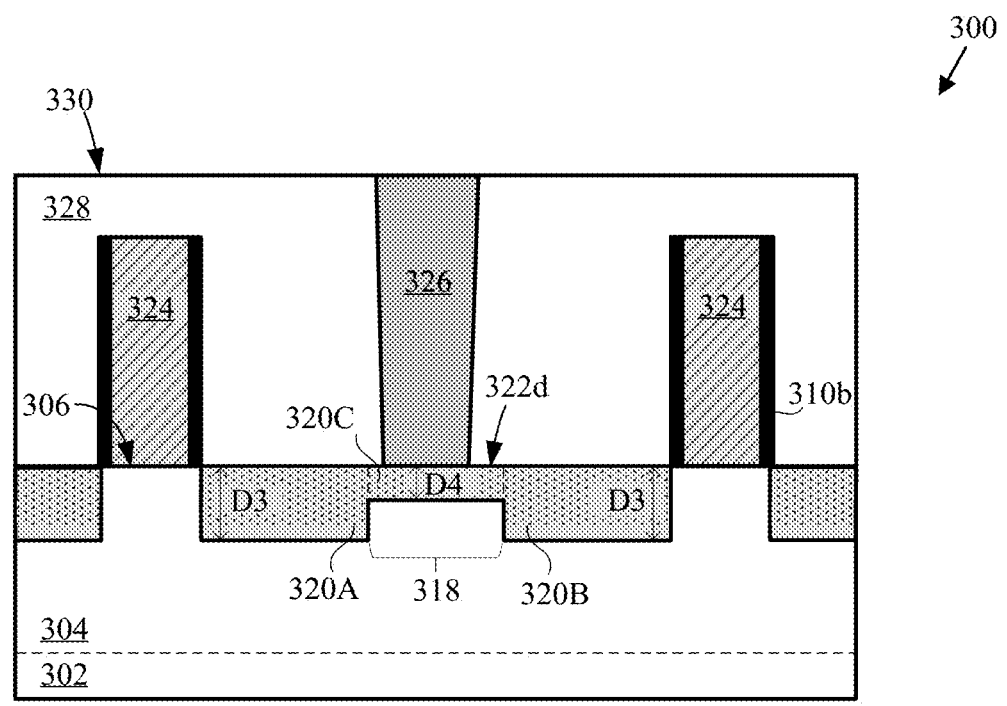

FIG. 3J illustrates the semiconductor device 300 after performing additional process steps to form replacement gate structures 324 and a contact structure 326, according to an embodiment of the disclosure. The process steps may include one or more deposition process operations to form gate insulating layer(s) (e.g., silicon dioxide, hafnium oxide, or a layer of high-k dielectric material having a dielectric constant of typically 10 or greater, etc.) and conductive layer(s) (e.g., seed layers, work function layers or fill layers, etc.) that may be part of the gate electrode of the replacement gate structure 324. The gate insulating layers and the conductive layers are not shown in the accompanying drawings.

The contact structure 326 is formed over and electrically coupling the semiconductor structures 320 between the replacement gate structures 324 using known semiconductor fabrication processes, including the following exemplary process. An insulating layer 328 is deposited over the replacement gate structures 324 and the semiconductor structures 320 using a suitable deposition process. A contact opening (not shown) is formed in the insulating layer 328, over the semiconductor structures 320, using suitable patterning processes. The contact opening is preferably equidistant from adjacent replacement gate structures 324.

A conductive material is deposited in the contact opening using a suitable deposition process. The conductive material may include tungsten, copper, aluminum, alloys of these metals and/or combinations thereof. In this embodiment of the disclosure, the contact structure is preferably formed of tungsten. The conductive material may overfill the opening and a suitable planarization process may be performed to form a top surface substantially coplanar with a top surface of the insulating layer 330.

Although not shown in FIG. 3J, one or more liners may be deposited during the formation of the contact structure 326. For instance, an adhesion liner and/or a barrier liner may be deposited in the contact opening before the conductive material deposition. The adhesion liner may include metal silicides, such as titanium silicide, nickel silicide or other suitable adhesion material having any suitable thickness. The barrier liner may include metal nitrides, such as titanium nitride, tantalum nitride or other suitable barrier material having any suitable thickness.

It is understood that the semiconductor devices 300 may undergo further processing to form various semiconductor features known in the art. For example, gate contacts may be formed in the insulating layer 328 to electrically couple the replacement gate structures 324 to other regions of the semiconductor device 300, e.g., back-end-of-line (BEOL) region of the semiconductor device 300. The BEOL region typically includes a plurality of conductive lines and interconnect vias that are routed, as needed, across the semiconductor device 300.

In the above detailed description, methods of forming semiconductor devices having multiple semiconductor structures in a wide gate pitch region are presented. By using the disclosed methods, multiple semiconductor structures are formed between adjacent gate structures in an active region having a lower local pattern density (e.g., in a wide gate pitch region). Substantially uniform semiconductor structures are formed adjacent to gate structures. The substantially uniform semiconductor structures have a width substantially equal to the minimum gate-to-gate spacing of the semiconductor device. The substantially uniform semiconductor structures are separated by an elevated section of the active region. The elevated section provides additional surface planes, thereby increases the local pattern density, enabling a substantially uniform growth of the semiconductor structures adjacent to the gate structures. A semiconductor bridge is formed over the elevated section and electrically coupling the substantially uniform semiconductor structures. The semiconductor bridge has a shallower depth than the substantially uniform semiconductor structures.

Although not shown in the accompanying drawings, more than two substantially uniform semiconductor structures may be formed between adjacent gate structures having a wide gate pitch, as long as each of the semiconductor structures has a width substantially equal to the minimum gate-to-gate spacing of the semiconductor device. For example, three semiconductor structures connected by two semiconductor bridges may be formed between adjacent gate structures. In another example, four semiconductor structures connected by three semiconductor bridges may be formed between adjacent gate structures.

A contact structure is formed between the adjacent gate structures and is positioned such that the contact structure is equidistant from the gate structures, effectively reducing parasitic capacitance between the contact structure and the adjacent gate structure. The contact structure is also fully contacting the semiconductor structures, advantageously reducing the electrical resistance between the contact structure and the semiconductor structures. Lowering parasitic capacitance and resistance in a semiconductor device is particularly advantageous for RF applications. Higher switching speed for high power RF devices with lower RF signal losses can be achieved when the semiconductor device is operating at a high frequency.

To further improve the performances of the RF devices, the contact structures of the RF devices are placed in a wide gate pitch region, allowing the contact structures to have wider widths than those contact structures positioned in a 1×CPP gate pitch region. Contact structures having wider widths will gain the beneficial effect of lower electrical resistance within the contact structures.

It should be appreciated that the design consideration of the contact structure needs to be carefully optimized and balanced between the width of the contact structure and the associated parasitic capacitance acceptance level and the contact electrical resistance acceptance level. The parasitic capacitance increases with decreasing distance between the contact structure and the gate structures. It is therefore advantageous to position the contact structure equidistant from the gate structures, thereby creating a greater distance between the contact structure and the gate structures. The contact electrical resistance, however, decreases with increasing widths of the contact structure. The wider width of contact structure will correspondingly induce higher parasitic capacitance between the adjacent gate structures. Therefore, the balance of the overall parasitic capacitance and contact electrical resistance needs to be carefully balanced when designing the semiconductor device for RF applications.

The terms "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A semiconductor device comprising:
   an active region having an elevated section over a substrate;
   a first gate structure and a second gate structure over the active region;
   a first semiconductor structure having a lower surface and a second semiconductor structure in the active region and between the first gate structure and the second gate structure, wherein the first semiconductor structure is adjacent to the first gate structure and the second semiconductor structure is adjacent to the second gate structure, and the elevated section of the active region separates the first semiconductor structure from the second semiconductor structure and the elevated section has an upper surface above the lower surface of the first semiconductor structure; and
   a semiconductor bridge in the active region electrically coupling the first semiconductor structure and the second semiconductor structure, wherein the semiconductor bridge comprises the same composition as the first semiconductor structure and the second semiconductor structure, and the semiconductor bridge is over the elevated section of the active region.

2. The semiconductor device of claim 1, wherein the semiconductor bridge has a thickness that is less than thicknesses of the first semiconductor structure and the second semiconductor structure.

3. The semiconductor device of claim 2, wherein the semiconductor bridge has an upper surface that is substantially coplanar with upper surfaces of the first semiconductor structure and the second semiconductor structure.

4. The semiconductor device of claim 2, wherein the first semiconductor structure has a first upper surface and the second semiconductor structure has a second upper surface, and the semiconductor bridge has upper surface above the first upper surface of the first semiconductor structure and the second upper surface of the second semiconductor structure.

5. The semiconductor device of claim 1, wherein the active region has an upper surface, the first semiconductor structure has a first upper surface, and the second semiconductor structure has a second upper surface, and the first upper surface of the first semiconductor structure and the second upper surface of the second semiconductor structure are substantially coplanar with the upper surface of the active region.

6. The semiconductor device of claim 1, wherein at least upper portions of the first semiconductor structure, the second semiconductor structure and the semiconductor bridge are doped to form a source or a drain region for the semiconductor device.

7. The semiconductor device of claim 6, further comprises a contact structure electrically coupled to the source or the drain region of the semiconductor device.

8. The semiconductor device of claim 1, further comprises a contact structure positioned equidistant from the first gate structure and the second gate structure.

9. The semiconductor device of claim 1, further comprises:
   a first array of gate structures having a first gate pitch; and
   a second array of gate structures having a second gate pitch, and the first gate structure and the second gate structure are part of the second array of gate structures, wherein the second gate pitch is wider than the first gate pitch.

10. The semiconductor device of claim 9, wherein the first semiconductor structure and the second semiconductor structure have a width substantially equal to a gate-to-gate spacing of the first array of gate structures.

11. A method of forming a semiconductor device comprising:
    providing an active region over a substrate, the active region having a top surface;
    forming a first gate structure and a second gate structure over an active region over a substrate, the active region having an upper surface;
    forming a first recessed region and a second recessed region in the active region separated by an elevated section of the active region between the first gate structure and the second gate structure, wherein the elevated section of the active region has an upper surface above a lower surface of the first recessed region; and
    forming a first semiconductor structure in the first recessed region, a second semiconductor structure in the second recessed region and a semiconductor bridge in the active region over the elevated section, wherein the semiconductor bridge comprises the same composition as the first semiconductor structure and the second semiconductor structure, and the semiconductor bridge electrically couples the first semiconductor structure and the second semiconductor structure.

12. The method of claim 11, further comprises forming the first semiconductor structure and the second semiconductor structure to have upper surfaces substantially coplanar with the upper surface of the active region.

13. The method of claim 11, wherein a semiconductor material is grown to form the semiconductor bridge having an upper surface above the upper surface of the active region.

14. The method of claim 11, further comprises forming a contact structure equidistant from the first gate structure and the second gate structure.

15. The method of claim 11, further comprises doping the first semiconductor structure, the second semiconductor structure and the semiconductor bridge to form a source or a drain region for the semiconductor device.

16. A method of forming a semiconductor device comprising:

forming a first gate structure and a second gate structure over an active region over a substrate, the active region having an upper surface;

forming a first recessed region and a second recessed region, separated by an elevated section of the active region formed therebetween, in the active region between the first gate structure and the second gate structure, wherein the elevated section of the active region has an upper surface above a lower surface of the first recessed region;

performing a first epitaxy process to fill the first recessed region to form a first semiconductor structure and the second recessed region to form a second semiconductor structure, wherein the first semiconductor structure and the second semiconductor structure have upper surfaces substantially coplanar with the upper surface of the active region; and performing a second epitaxy process to grow a semiconductor bridge in the active region over the elevated section to electrically couple the first semiconductor structure and the second semiconductor structure, wherein the semiconductor bridge comprises the same composition as the first semiconductor structure and second semiconductor structure.

17. The method of claim 16, further comprises:
recessing the first semiconductor structure, the second semiconductor structure and the elevated section to a level below the upper surface of the active region; and
the second epitaxy process grows the first semiconductor structure, the second semiconductor structure, and the semiconductor bridge to have upper surfaces that are substantially coplanar with the upper surface of the active region.

18. The method of claim 16, wherein the first recessed region and the second recessed region are formed having a width substantially equal to a minimum gate-to-gate spacing of the semiconductor device.

19. The method of claim 16, further comprises forming a contact structure above the first semiconductor structure and the second semiconductor structure equidistant from the first gate structure and the second gate structure.

* * * * *